US007659542B2

(12) United States Patent
Tsukuda

(10) Patent No.: US 7,659,542 B2
(45) Date of Patent: Feb. 9, 2010

(54) SILICON PLATE, PRODUCING METHOD THEREOF, AND SOLAR CELL

(75) Inventor: Yoshihiro Tsukuda, Fujiidera (JP)

(73) Assignee: Sharp Kabushiki Kaisha, Osaka (JP)

( * ) Notice: Subject to any disclaimer, the term of this patent is extended or adjusted under 35 U.S.C. 154(b) by 422 days.

(21) Appl. No.: 11/413,030

(22) Filed: Apr. 28, 2006

(65) Prior Publication Data

US 2006/0202208 A1    Sep. 14, 2006

Related U.S. Application Data

(62) Division of application No. 10/487,850, filed as application No. PCT/JP02/10636 on Oct. 11, 2002, now Pat. No. 7,071,489.

(30) Foreign Application Priority Data

Oct. 18, 2001  (JP) .............................. 2001-320602

(51) Int. Cl.
*H01L 29/04* (2006.01)
(52) U.S. Cl. .................... 257/75; 257/64; 257/756; 257/E27.124
(58) Field of Classification Search ............... 257/75, 257/755, 16, 64, 764–756, E27.124–126, 257/E25.007, E25.009
See application file for complete search history.

(56) References Cited

U.S. PATENT DOCUMENTS

| 5,712,199 | A  | 1/1998 | Nakagawa et al. |
| 6,110,274 | A  | 8/2000 | Okuno |
| 6,111,191 | A  | 8/2000 | Hall et al. |
| 6,287,944 | B1 | 9/2001 | Hara et al. |
| 6,413,313 | B1 | 7/2002 | Yoshida et al. |
| 6,521,827 | B2 | 2/2003 | Tsukuda et al. |
| 6,566,754 | B2 * | 5/2003 | Hara et al. .................... 257/755 |
| 6,596,075 | B2 | 7/2003 | Igarashi et al. |

FOREIGN PATENT DOCUMENTS

| EP | 1 085 559   | 3/2001 |
| EP | 1 113 096   | 7/2001 |
| JP | 59-92909    | 5/1984 |
| JP | 61-275119   | 12/1986 |
| JP | 4-152516    | 5/1992 |
| JP | 11-21120    | 1/1999 |
| JP | 2000-302431 | 10/2000 |

(Continued)

OTHER PUBLICATIONS

U.S. Appl. No. 10/487,850, filed Feb. 27, 2004.

(Continued)

*Primary Examiner*—Thinh T Nguyen
(74) *Attorney, Agent, or Firm*—Nixon & Vanderhye, P.C.

(57) ABSTRACT

A polycrystalline silicon plate has grain boundary lines on a surface thereof, and at least one of the grain boundary lines is a quasi-linear grain boundary line (1). The silicon plate is used to produce a solar cell. The silicon plate is formed using a base substrate having an irregular surface provided with dotted or linear protrusions, which makes it possible to control the grain boundary lines. As such, an inexpensive and high-quality silicon plate can be provided. Further, by employing this silicon plate to produce a solar cell, an inexpensive and high-quality solar cell can be provided as well.

1 Claim, 7 Drawing Sheets

FOREIGN PATENT DOCUMENTS

| | | |
|---|---|---|
| JP | 2001-151505 | 6/2001 |
| JP | 2001-223172 | 8/2001 |
| JP | 2001-247396 | 9/2001 |
| JP | 2003-001162 | 1/2003 |
| WO | WO 03/049162 | 6/2003 |

OTHER PUBLICATIONS

Steinbach et al, "Microstructural Analysis of the Crystallization of Silicon Ribbons Produced by the RGS Process", IEEE, 26$^{th}$ PVSC, 1997, pp. 91-93.

* cited by examiner

SILICON PLATE, PRODUCING METHOD THEREOF, AND SOLAR CELL

This application is a Divisional of application Ser. No. 10/487,850 filed Feb. 27, 2004 now U.S. Pat. No. 7,071,489, which is a 371 (national stage) of PCT/JP02/10636 filed Oct. 11, 2002, which designates the United States, which claims priority on JP 2001-320602 filed Oct. 18, 2001, the entire contents of which are all hereby incorporated herein by reference in this application.

TECHNICAL FIELD

The present invention relates to a silicon plate characterized by grain boundary lines existing in the surface thereof. The present invention further relates to a solar cell formed of the silicon plate, and a producing method of the silicon plate.

BACKGROUND ART

Conventionally, solar cells have been manufactured with monocrystal silicon wafers. The monocrystal silicon wafers, however, are very expensive due to a long period of time required for formation thereof, making the solar cells employing them very expensive as well.

In recent years, silicon solar cells having polycrystalline silicon substrates have increasingly been lowered in cost, and its production amount has considerably increased. For widespread use of the solar cells, however, further reduction in cost is required.

Currently, for such rapidly prevailing solar cells, polycrystalline silicon is mainly used as the substrates. The polycrystalline silicon is often produced by casting, as disclosed, e.g., in Japanese Patent Laying-Open No. 11-21120. In the casting technique, molten silicon in a crucible is gradually cooled from the bottom of the crucible for solidification of silicon, to obtain an ingot having long grains grown from the bottom of the crucible as its main body. This ingot is sliced into thin plates to obtain wafers available for the solar cells.

As another way of forming a thin silicon plate without the necessity of such a slicing step, lateral pulling is disclosed, e.g., in Japanese Patent Laying-Open No. 2000-302431. A receiving tank holds silicon in the molten state, and a solidifying tank placed adjacent to the receiving tank holds molten metal at a temperature lower than the silicon solidifying temperature. The molten silicon is laterally pulled, while being in contact with the molten metal in the solidifying tank, so that it is cooled and solidified into a silicon plate continuously.

In the solidifying tank, tin, tin alloy or the like, having a solidifying point lower than that of silicon, is kept at a temperature higher than its solidifying point, for solidification of the molten silicon.

As yet another method, silicon ribbon growth without the necessity of slicing has been studied for about 20 years. In particular, the RGS (ribbon growth silicon) and other techniques have attracted attention for growth of silicon at higher speed. With the RGS technique, a thin plate of silicon is formed directly from a silicon melt. The idea is to realize high-speed growth of the silicon substrate by rapid heat transfer (extraction of the heat) from the surface dose to its solidification-growth front.

With the RGS method, the bottom flat-plate portion of the crucible filled with the molten silicon is moved in a lateral direction while being cooled, to achieve rapid growth of the silicon plate ("MICROSTRUCTURAL ANALYSIS OF THE CRYSTALLIZATION OF SILICON RIBBONS PRODUCED BY THE RGS PROCESS", I. Steinbach et al., 26th PVSC, 1997, pp. 91-93). As the bottom flat-plate portion is pulled out of the melt, silicon on the flat plate immediately after the pull-out is of a liquid phase, which is cooled down simultaneously from the two surfaces, i.e., from the under surface of the pulled out flat plate and from the surface of the silicon.

Japanese Patent Laying-Open No. 61-275119 describes another method of forming a silicon ribbon, where a surface of a water-cooled metal roll (base substrate) is immersed in the silicon melt to form a solid silicon layer on the surface of the base substrate. This method has a purifying effect, with which a solidified ribbon having purity higher than that of the molten silicon is obtained.

The above-described conventional ways of producing silicon wafers from a silicon ingot and producing a silicon plate directly from silicon in the molten state have the following problems.

Firstly, with the casting method, silicon molten in a crucible is solidified. When the silicon melt is solidified, it expands and suffers stress from the wall surface of the crucible. To improve the crystal quality while relaxing such stress and suppressing generation of cracks, it takes a long time to produce an ingot. Further, after the ingot is produced, a batch-type slicing step is required for processing the ingot into wafers. The slicing step is conducted using a multi-wire saw, for example, to form a plurality of wafers at one time. However, the slicing takes another tens of hours. As such, with the casting method, it is difficult to provide a low-cost wafer, since it takes a long time to complete the wafers, and the slice losses during the slicing step would lower the utilization efficiency of the raw material of silicon. Further, the obtained wafers differ in quality of crystals near the bottom, near the wall, and at the center of the crucible.

In the lateral pulling method as disclosed in Japanese Patent Laying-Open No. 2000-302431, the silicon melt is pulled out in the lateral direction, which is passed through the solidifying tank filled with the molten metal of tin or tin alloy, to obtain a silicon plate. According to the method, the long period of time otherwise required for producing an ingot can be saved. The slicing step is also unnecessary, preventing the slice losses. Thus, the utilization efficiency of the silicon raw material can be increased. Further, since the crystals are obtained by extraction of the heat from the surface of the molten metal in the solidifying tank, they can be oriented in one direction. However, it would be difficult to perform strict heat control, since the solidifying tank filled with the molten metal is placed adjacent to the receiving tank of the silicon melt. More specifically, while the silicon melting point is about 1420° C., the tin melting point is 232° C., and thus, the interface between the receiving tank of the silicon melt and the solidifying tank containing the tin melt will be considerably affected by the heat convection. Further, if the temperature of the solidifying tank is raised to avoid such effects of the convection, considerable impurity contamination will occur due to generation of vapor from the molten metal in the solidifying tank.

In the RGS ribbon producing method, the stable growth itself is difficult. It is described that, at the growth front of the obtained crystal, silicon solidifies and grows with the solid-liquid interface being at an angle with respect to the flat-plate surface. It is also described that the grain is of a columnar crystal perpendicular to the flat-plate surface. However, the crystals are uncontrolled, and there would be considerable differences in property among the solar cells. Thus, although inexpensive silicon plates may be produced, the cell process needs to be modified in order to improve or stabilize the properties of the resultant solar cells. This requires a complicated process, hindering production of an inexpensive solar cell.

In the another silicon ribbon producing method disclosed in Japanese Patent Laying-Open No. 61-275119, it is described that a silicon ribbon having a grain size of at least 100 μm is obtained. It however does not include any detailed explanation.

Based on the foregoing, an object of the present invention is to overcome the above-described problems, so as to provide an inexpensive wafer and a producing method thereof.

DISCLOSURE OF THE INVENTION

A silicon plate according to an aspect of the present invention is a polycrystalline silicon plate having grain boundary lines in a surface thereof, wherein at least one of the grain boundary lines is a quasi-linear grain boundary line.

A silicon plate according to another aspect of the present invention is a polycrystalline silicon plate having grain boundary lines in a surface thereof, wherein at least one of the grain boundary lines is a quasi-linear grain boundary line, and at least 90% of grains forming the quasi-linear grain boundary line are arranged at random.

A silicon plate according to a further aspect of the present invention is a polycrystalline silicon plate having grain boundary lines in a surface thereof, wherein at least two of the grain boundary lines are quasi-linear grain boundary lines approximately parallel to each other.

A silicon plate according to a still further aspect of the present invention is a polycrystalline silicon plate having grain boundary lines in a surface thereof, wherein at least two of the grain boundary lines are quasi-linear grain boundary lines crossing each other.

A silicon plate according to yet another aspect of the present invention is a polycrystalline silicon plate having grain boundary lines in a surface thereof, wherein at least two of the grain boundary lines are quasi-linear grain boundary lines crossing each other, and an acute angle at their crossing point is at least 30° and not greater than 90°.

A silicon plate according to yet another aspect of the present invention is a polycrystalline silicon plate having grain boundary lines in a surface thereof, wherein the grain boundary lines have a pitch of at least 0.05 mm and not greater than 5 mm.

The silicon plates as described above may further be characterized in that the quasi-linear grain boundary line in the surface of the silicon plate is located corresponding to a concave on a surface of a base substrate provided with protrusions and concaves, that not more than 50 such quasi-linear grain boundary lines are included in a range of 100 mm² of the surface of the silicon plate, or that an area of a section delimited by the quasi-linear grain boundary lines in the surface of the silicon plate is not smaller than 0.25 mm².

A solar cell according to an aspect of the present invention is obtained by forming electrodes on the silicon plate having the quasi-linear grain boundary lines.

A solar cell according to another aspect of the present invention is characterized in that the solar cell is formed on the silicon plate having the quasi-linear grain boundary lines.

A producing method of the silicon plate according to an aspect of the present invention includes the step of forming the silicon plate by solidifying molten silicon on a base substrate at a temperature of not higher than a silicon melting temperature. The producing method of the silicon plate is further characterized in that the base substrate has a portion with protrusions and concaves at least on its surface coming into contact with the molten silicon, and the protrusions are arranged linearly.

BEST MODES FOR CARRYING OUT THE INVENTION

The silicon plate according to the present invention is characterized in that, in a polycrystalline silicon plate having grain boundary lines existing in its surface and extending over the plate, at least one of the grain boundary lines is formed as a quasi-linear grain boundary line having a certain regularity.

Firstly, the grain boundary line related to the present invention is explained. A plate of polycrystalline silicon is an aggregate of a plurality of crystals, so that there are a great number of grains in the surface. Herein, the grain boundary line refers to a line obtained by connecting the grain boundaries each existing between a crystal and another crystal adjacent thereto.

Figure 1:
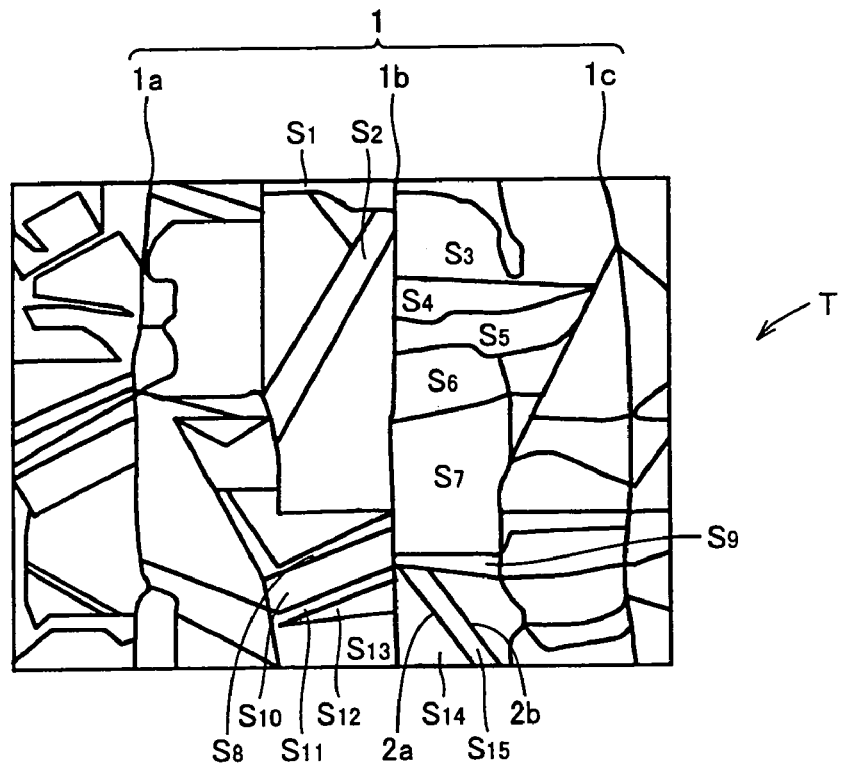
FIG. 1 schematically shows a silicon plate having quasi-linear grain boundary lines according to the present invention.

As shown in FIG. 1, there are quasi-linear grain boundary lines 1 (1a, 1b and 1c) in the surface of the silicon plate T according to the present invention. Among the grain boundary lines existing in the surface of the substrate, the quasi-linear grain boundary line refers, not to the one existing around a single grain, but to the one shared by at least three grains.

Specifically, in FIG. 1, grain boundary line 1b, extending from a grain $S_1$ to a grain $S_{13}$, extends approximately linearly along at least three grains.

For example, although a grain boundary line 2a between grains is linear, it exists in the periphery of one grain. In other words, it is the grain boundary line between two grains $S_{14}$ and $S_{15}$. Although such a grain boundary line may be superior in linearity, it is not herein referred to as the quasi-linear grain boundary line, since it is often the case that such a grain boundary line having excellent linearity is sandwiched by twin crystals. This type of grain boundary line is often accompanied by another grain boundary line 2b parallel thereto.

Figure 2:
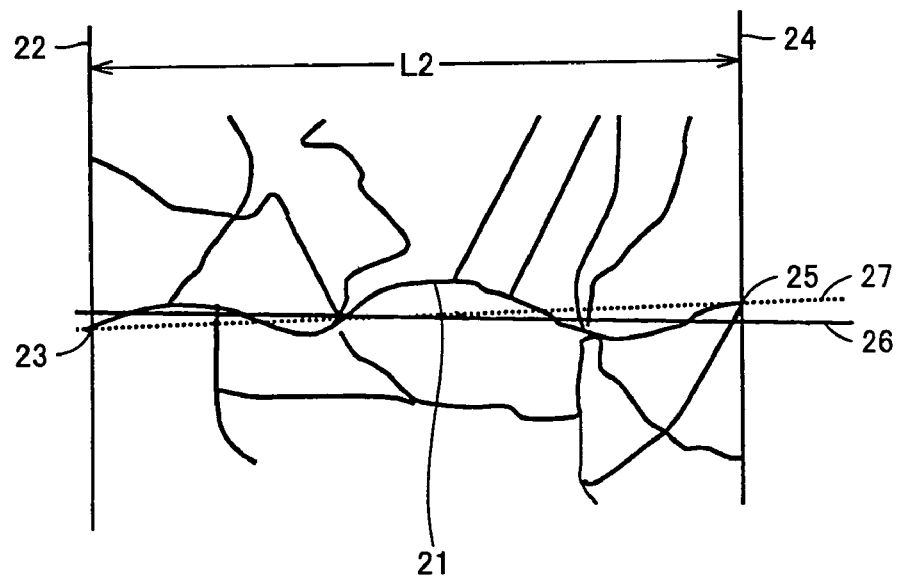
FIG. 2 schematically shows a portion of the silicon plate having the quasi-linear grain boundary lines according to the present invention.

The case where a quasi-linear grain boundary line crosses the surface of the substrate is now explained with reference to FIG. 2. In FIG. 2, a quasi-linear grain boundary line 21 extends from a side 22 to another side 24 of the substrate. Grain boundary line 21 intersects with side 22 at a starting point 23, and with side 24 at an end point 25. A straight line 26 approximating the grain boundary line 21 and another straight line 27 connecting starting point 23 and end point 25 are drawn.

Quasi-linear grain boundary line 21 of the present invention refers to a line that follows the grain boundaries in a shortest distance from starting point 23 to end point 25. Since the respective grain boundary lines differ in orientation, they may branch at a position where grains meet with each other. In such a case, the quasi-linear grain boundary line is led toward the end point 25. As such, the quasi-linear grain boundary line can be determined by following the grain boundary lines from starting point 23 to end point 25. In this figure, the quasi-linear grain boundary line of the present invention is in contact with 14 grains.

Although the grain boundary line has been explained in conjunction with FIG. 2, starting point 23 and end point 25 do not necessarily have to be located at the sides of the silicon plate. They may be placed within the surface of the silicon plate. In such a case, the quasi-linear grain boundary line exists in a portion of the surface of the substrate, rather than crossing the silicon plate from one side to another side. The length L1 (not shown) of the straight line approximating the quasi-linear grain boundary line 21 is set to preferably at least 100% and not greater than 150%, more preferably at least 100% and not greater than 120%, and most preferably at least 100% and not greater than 110%, of the length L2 of the straight line connecting starting point 23 and end point 25. It is noted that the grain boundary line of the present invention is not necessarily linear, although well controlled.

Figure 3:
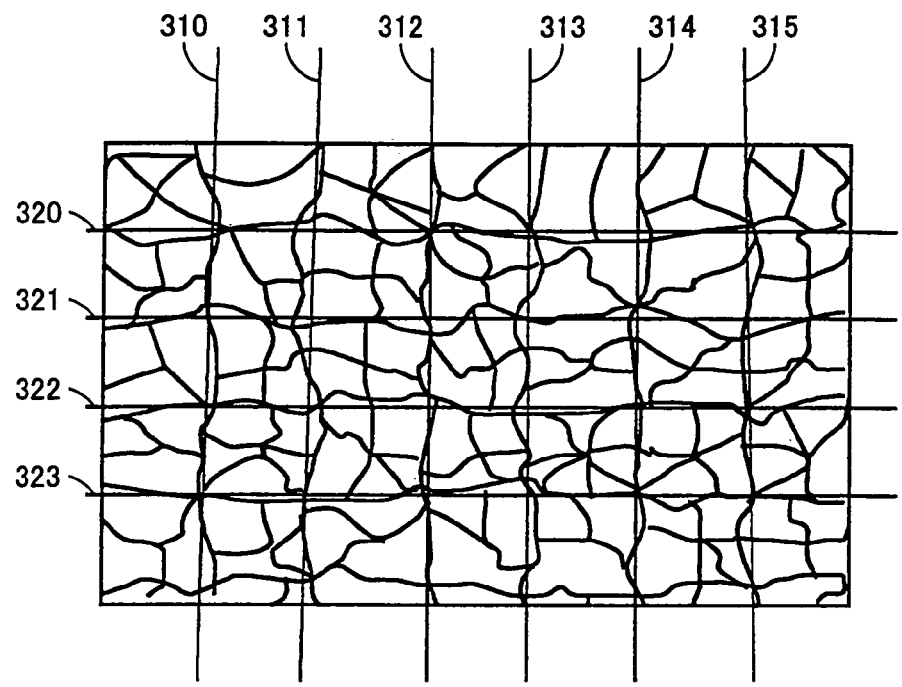
FIG. 3 schematically shows another silicon plate having quasi-linear grain boundary lines according to the present invention.

The case where the quasi-linear grain boundary lines cross each other is now explained with reference to FIG. 3. FIG. 3 shows straight lines 310-315 approximating respective quasi-linear grain boundary lines extending in a vertical direction and straight lines 320-323 approximating respective quasi-linear grain boundary lines extending in a horizontal direction. In FIG. 3, the six straight lines approximating the quasi-linear grain boundary lines extending in the vertical lines are parallel to each other, and the four straight lines approximating the quasi-linear grain boundary lines extending in the horizontal lines are also parallel to each other. Although any two straight lines approximating the quasi-linear grain boundary lines in the same direction may not be parallel in the strict sense, they are preferably controlled to extend approximately parallel to each other.

Further, in FIG. 3, the approximately parallel quasi-linear grain boundary lines are arranged to form a grid. The silicon plate having the quasi-linear grain boundary lines controlled to cross each other in this manner is most preferable, since it is convenient for use in formation of a solar cell, as will be described later.

Although the distances between the parallel quasi-linear grain boundary lines or between the approximate straight lines are approximately equal to each other in FIG. 3, the present invention is not limited thereto. The shape delimited by the approximate straight lines, which is approximately square in the figure, may be rectangular, triangular or hexagonal.

Figure 12:
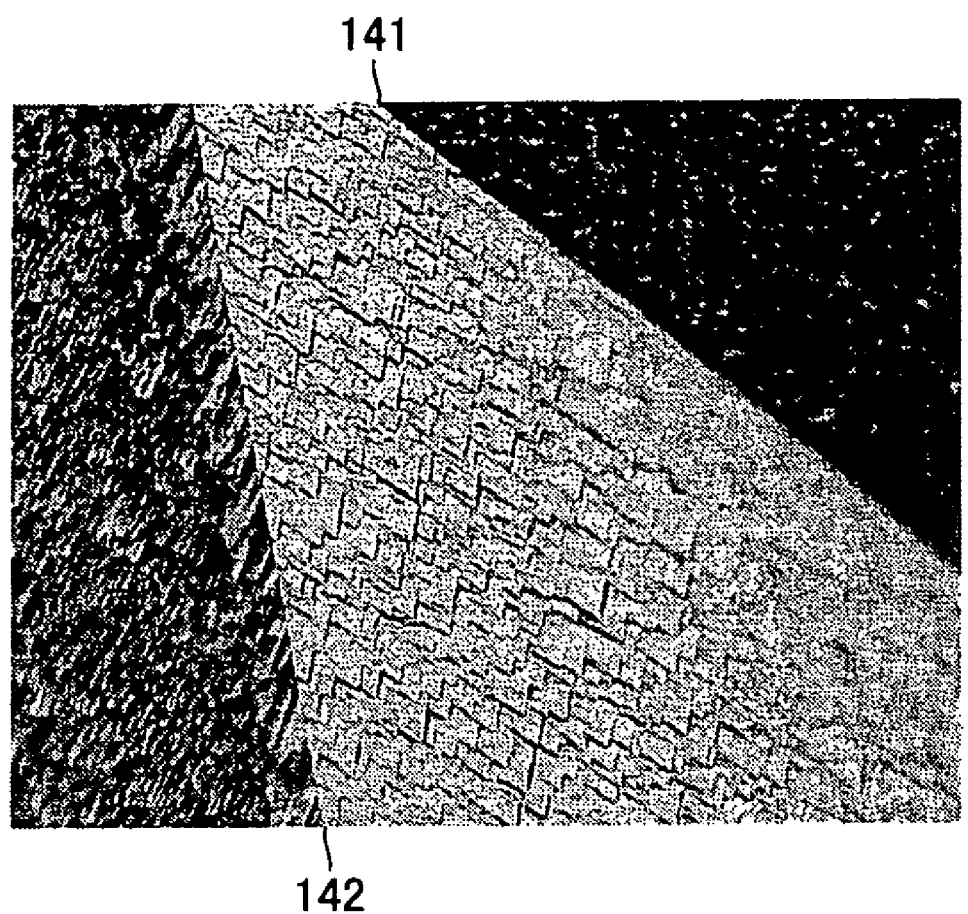
FIG. 12 is an optical microphotograph of a casted substrate obtained after a conventional silicon plate is subjected to alkali etching.

A method of extracting the grain boundary lines as shown in FIGS. 1-3 is now described. For example, assume the case of a casted substrate that is obtained after a conventional silicon plate is subjected to alkali etching. As shown in FIG. 12, the casted substrate has two grain boundary lines 141 and 142. However, there are only two grains sandwiching each grain boundary line, so that it does not correspond to the present invention. Such grain boundary lines may be extracted by alkali etching as described above, or by acid etching following polishing of the plate surface, enabling more detailed examination thereof. The alkali or acid etching may be followed by digital image processing using commercially available software, to further clarify the grain boundary lines.

The silicon plate of the present invention is characterized in that it has a quasi-linear grain boundary line as shown in FIGS. 1-3, for example. On the other hand, the quasi-linear grain boundary line existing also in the casted substrate is located particularly in the periphery of an elongated grain. Further, while only two or a slightly greater number of grains are in contact with the quasi-linear grain boundary line existing in the casted substrate, there are a greater number of grains along the quasi-linear grain boundary line of the present invention. The casted substrate is generally in a square or rectangular shape that is about 50-155 mm long vertically and about 50-155 mm long horizontally, since a columnar ingot is produced and a wire saw or the like is used to cut the ingot. As such, the shape of the wafer is restricted to a quadrangle such as approximately rectangle or square, corresponding to the shape of the ingot. In the casted substrate of this general size, it is unlikely that any quasi-linear grain boundary line extends from one side to another side thereof. That is, the quasi-linear grain boundary lines existing in the casted substrate are irrelevant to the present invention.

The obtained silicon plate having the quasi-linear grain boundary lines has a perimeter of preferably at least 100 mm. If the perimeter is shorter than 100 mm, it takes a long time to produce a device. As a result, even if an inexpensive silicon plate may be provided, it is difficult to provide the device at low cost. If the perimeter is longer than 100 mm, it is possible to shorten the time required for production of the device and an inexpensive device can be provided. When a solar cell is formed of a silicon plate, a larger silicon plate is more preferable, since a greater output current can be obtained from the solar cell with the silicon plate of a greater area.

Further, the obtained silicon plate has a side preferably not shorter than 20 mm. For example, even if the perimeter is 100 mm, if the silicon plate is in a rectangular shape having a vertical length of 10 mm and a horizontal length of 40 mm, quasi-linear grain boundary lines common in the casted substrate may appear in the plate. The grain boundary lines common in the casted substrate, however, occur spontaneously as described above, which are uncontrolled and accompanied by elongated grains.

It is preferable, in the state where the silicon plate is formed into a device such as a solar cell, that the quasi-linear grain boundary line of the present invention penetrates from one side to another side of the polygon. In particular, it is preferable that the quasi-linear grain boundary line penetrates the silicon plate to emphasize its effect, although the quasi-linear grain boundary line extending partially in the surface of the silicon plate exhibits its effect to some extent. It is still more preferable that the device is in the rectangular form, and the quasi-linear grain boundary line extends from a side to the opposite side thereof.

The present invention is characterized in that the silicon plate has a quasi-linear grain boundary line. The quasi-linear grain boundary line can be controlled by the producing method of the silicon plate according to the present invention. In other words, the quasi-linear grain boundary line of the present invention is not formed spontaneously, but formed intentionally. Thus, there are only few cases where the grains existing around the quasi-linear grain boundary line of the present invention are narrow or elongated grains.

Generally, grains are enlarged so as to improve the properties of the solar cell. This reduces the number of grain boundaries existing in the surface of the wafer. However, since the quasi-linear grain boundary line of the present invention has a great number of grains adjacent thereto, a large number of grains exist in the vicinity thereof. Explanation is now given for the characteristics of the silicon plate having the quasi-linear grain boundary line of the present invention and the benefits when such a silicon plate is used for a solar cell.

Figure 4:
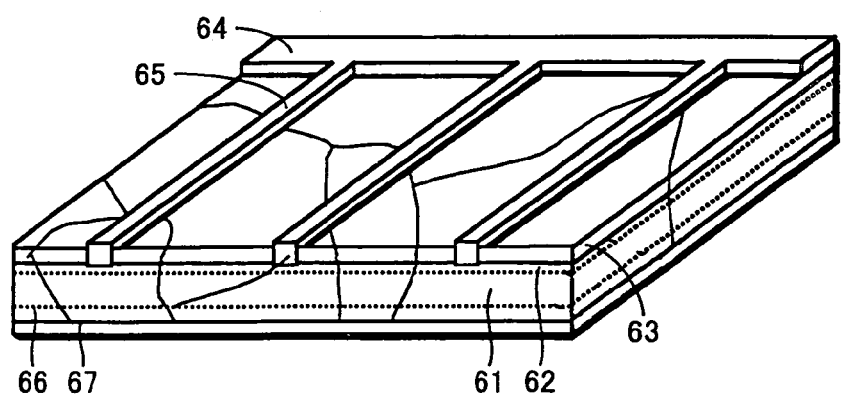
FIG. 4 is a perspective view showing a conventionally employed common polycrystalline solar cell.

As shown in FIG. 4, a conventional, commonly used polycrystalline solar cell has a p type polycrystalline substrate 61. Formed on one side of the substrate are an n layer 62, an anti-reflective film 63, a bas-bar electrode 64 as a main electrode of a photo accepting surface electrode that is formed by silver paste, and a finger electrode 65 as a sub electrode of the photo accepting surface electrode. Formed on the other side of p type polycrystalline substrate 61 are a p$^+$ layer 66, and a back surface electrode 67 that is formed by aluminum paste. Anti-reflective film 63 formed on the light-incident side of the solar cell is for suppressing reflection of the sunrays to improve the properties of the solar cell. As the anti-reflective film, a $SiN_x$ film (silicon nitride film), a $TiO_2$ film (titanium oxide film), a $SiO_2$ film (silicon dioxide film), a $MgF_2$ film (magnesium fluoride film), and a multi-layered film formed thereof may be employed. In particular, the $SiN_x$ film is suitable when a polycrystalline substrate is employed. In forming the $SiN_x$ film, $SiH_4$ (silane) and $NH_3$ (ammonia) and/or $N_2$ (nitrogen) are introduced into the chamber, and the film is deposited within the RF plasma. When $SiH_4$ or $NH_3$ is decomposed, hydrogen radicals are generated, which has an effect of inactivating the grain boundaries, defects and others. In other words, inactivation is performed along with formation of the anti-reflective film, to improve the properties of the solar cell.

Presence of such quasi-linear grain boundary lines as of the present invention is advantageous to passivation (inactivation) of the grain boundaries, compared to the case where the grain boundary lines having no regularity as in the casted substrate are present. In forming the anti-reflective film using a plasma CVD apparatus, a sample is set in parallel with electrodes, and a high-frequency voltage is applied between the cathode electrode and the anode electrode. The cathode electrode is provided with holes through which gas can pass. The gas having passed through the holes is decomposed by plasma into radicals. That is, simply setting the holes for the gas corresponding to the quasi-linear grain boundary lines makes it possible to inactivate the grain boundaries and defects, without the need of a special, complicated apparatus, and a solar cell having excellent solar cell properties can be obtained.

Further, since the grain boundary lines inferior in quality to within the grains are arranged linearly, selective passivation (inactivation) of the portions that would otherwise cause degradation of the solar cell properties becomes possible. In the portion having such quasi-linear grain boundary lines, hydrogen can be introduced relatively easier than in the portion having curved grain boundary lines. Thus, provision of the quasi-linear grain boundary line is very effective, not only when introducing hydrogen radicals at the time of forming the anti-reflective film, but also when performing hydrogen processing during the cell process. The hydrogen processing during the cell process may include heat treatment using nitrogen gas containing 3% hydrogen, and hydrogen processing conducted in the plasma. The method for hydrogen processing, however, is not restricted specifically, as long as hydrogen gas or hydrogen radicals can be introduced along the quasi-linear grain boundary line.

The quasi-linear grain boundary line in the polycrystalline silicon plate according to the present invention can be etched faster than another grain boundary line. It is generally known that the grain boundaries are etched faster than within the grains. It is also true that the etching rates vary among the grain boundary lines. The etching rate of the quasi-linear grain boundary line of the present invention is fast, since association between the grains sandwiching the quasi-linear grain boundary line is small.

The quasi-linear grain boundary line of the present invention is formed intentionally, which means that the position of the grain boundary line can also be controlled. Since it is known in advance where in the obtained silicon plate the grain boundary lines will be formed, it is readily possible to recover the cell properties in the solar cell process. Further, since the growth rate of the silicon plate is sufficiently faster than that of the casted substrate, it is possible to considerably reduce the manufacturing cost of the solar cell. This is mainly because slicing is unnecessary and thus the cost and time required for the slicing can be saved and slicing losses can be eliminated.

The polycrystalline silicon plate is characterized in that, of the grain boundary lines crossing its surface, the quasi-linear grain boundary line is formed of grains of which at least 90% are arranged at random. More specifically, the grains sandwiching the quasi-linear grain boundary line of the present invention have little association therebetween.

This means that the quasi-linear grain boundary line of the present invention does not include a grain boundary line sandwiched by twin crystals. It is often the case that the quasi-linear grain boundary between grains that exists in the casted substrate is formed between the twin crystals. Such a grain boundary differs in characteristics from the quasi-linear grain boundary line of the present invention. In the present invention, not the grains but the grain boundary lines are controlled. The controlled grain boundary lines are preferable, since it enables selective passivation with hydrogen as described above.

Preferably, of the grain boundary lines crossing the surface of the polycrystalline silicon plate, at least two quasi-linear grain boundary lines are formed approximately parallel to each other, which is advantageous in forming a solar cell. As shown in FIG. 4, a plurality of finger electrodes 65 of the photo accepting surface electrode of the solar cell are formed in parallel with each other. A solar cell is generally formed of bas-bar electrodes 64 (main grid) and finger electrodes 65 (sub grid), where finger electrodes 65 are formed in parallel. This is a technique necessary to improve the solar cell properties, as it can lower the series resistance of the solar cell. Formation of the quasi-linear grain boundary lines of the present invention in parallel makes it possible to arrange the finger electrodes along the quasi-linear grain boundary lines advantageously.

In the present invention, the pitch of the grain boundary lines, i.e., the length of one grain constituting the grain boundary line, is preferably at least 0.05 mm and not longer than 10 mm, more preferably at least 0.1 mm and not longer than 5 mm, and still more preferably at least 0.5 mm and not longer than 3 mm.

If the pitch of the grain boundary lines is less than 0.05 mm, the grain size itself becomes undesirably small. On the other hand, if the pitch exceeds 10 mm, although the grain size becomes large, it is difficult to provide an inexpensive solar cell. More specifically, when the pitch of the grain boundary lines increases, while the grain size tends to increase, the surface roughness of the obtained silicon plate would increase as well. This makes it difficult to perform a low-cost printing process at the time of formation of electrodes, and as a result, it becomes difficult to provide an inexpensive solar cell.

A commercially available solar cell has finger electrodes formed with a pitch of about 2-3 mm. It is thus preferable to design the grain boundary lines with the corresponding pitch. To provide a solar cell of favorable solar cell properties, a pitch of not smaller than 10 mm may be used. In such a case, however, growth of the silicon plate takes a long time. Further, the printing process cannot easily be used and thus vapor deposition is conducted to form the electrodes, making the cell process (steps) for producing the solar cell complicated.

The polycrystalline silicon plate is characterized in that, of the grain boundary lines crossing the surface of the silicon plate, at least two quasi-linear grain boundary lines cross each other. Further, the at least two quasi-linear grain boundary lines crossing each other form an acute angle of at least 30° and not greater than 90° at the crossing point.

In the present invention, the quasi-linear grain boundary lines cross each other. There should be at least two quasi-linear grain boundary lines forming an acute angle of preferably not smaller than 30° and not greater than 90°.

That the grain boundary lines cross each other at an angle of 90° means that they are arranged as shown in FIG. 3. The approximate straight lines 310-315 are arranged approximately in parallel. Crossing these lines are the approximate straight lines 320-323, which are also arranged approximately in parallel. For example, approximate straight lines 310 and 320 cross each other at about 90°. Similarly, approximate straight lines 310-315 each cross the respective approximate straight lines 320-323 at about 90°.

For the purpose of producing a solar cell, it is particularly preferable that the grain boundary lines cross each other at 90°, since the main grid and the sub grid forming the photo accepting surface electrode of the commercially available solar cell cross each other at 90°. The silicon plate of the present invention is configured to have a structure suitable for improving the solar cell properties.

It is further preferable that the two quasi-linear grain boundary lines cross each other at an acute angle of not smaller than 30°. By setting the angle to not smaller than 30° and not greater than 90°, the process window at the time of producing the silicon plate is widened. Still further, controlling the angle in this manner has an advantageous effect on formation of the solar cell.

A solar cell is obtained by forming electrodes on the silicon plate of the present invention. The electrodes are necessary when the silicon plate of the present invention is used for an optical device such as a solar cell. In forming the solar cell, electrodes of low resistance are formed to improve the properties of the solar cell. The solar cell is usually placed outdoors, so that certain strength is also required for the electrodes. Thus, it is preferable to form a photo accepting surface electrode using Ag as its main component and subjecting the same to solder coating, and to form a back surface electrode using low-cost Al as its main component. The photo accepting surface electrode is made as narrow as possible to increase the amount of incident light, and the back surface electrode is made as wide as possible to increase the effect of the $p^+$ layer.

The present invention provides a solar cell characterized in that the silicon plate is employed for its substrate. In the present invention, the obtained silicon plate is used as a substrate (base) for the solar cell. That is, the silicon plate of the present invention can suitably be used for the substrate of a thin-film solar cell that is produced using plasma CVD or the like. Normally, a glass substrate, a quartz substrate, a metal substrate or a silicon wafer is used for the substrate (base) of the thin-film solar cell. These substrates however are often poor in heat resistance and costly. By comparison, the silicon plate of the present invention is inexpensive and excellent in heat resistance, so that it can be utilized for the substrate of the thin-film solar cell without any problems. For producing a solar cell, normally, a high-purity silicon raw material, or an unnecessary portion of CZ or FZ crystal for semiconductor used for an IC or the like, i.e., a top or bottom portion of the ingot, is employed. However, particularly high-purity silicon is unnecessary as the substrate of the thin-film solar cell. That is, silicon formed into a plate, even with low purity, can be used for the substrate of the thin-film solar cell. This means that a substrate for a thin-film solar cell can be produced with a less expensive raw material.

Figure 5:
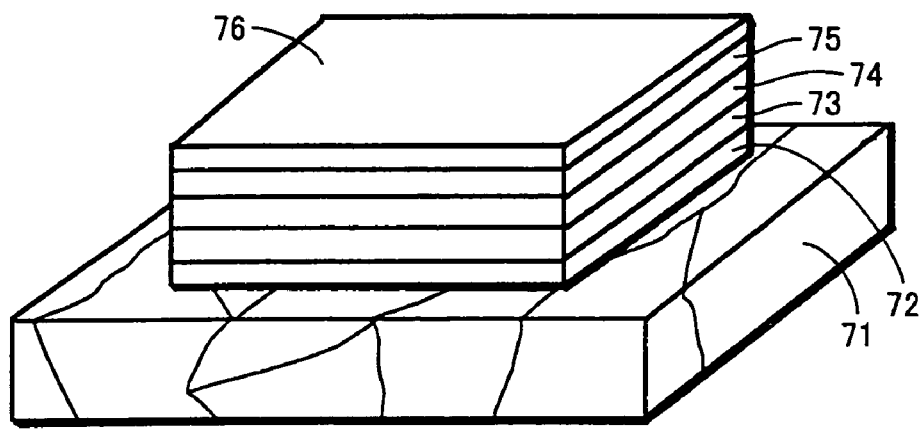
FIG. 5 is a schematic perspective view of a solar cell employing the silicon plate having the quasi-linear grain boundary lines according to the present invention.

A solar cell produced using the silicon plate having the quasi-linear grain boundary lines of the present invention is now described. As shown in FIG. 5, the solar cell employing the silicon plate having the quasi-linear grain boundary lines of the present invention has a back surface electrode 72, an n layer 73, an i layer 74, a p layer 75, and an anti-reflective film 76, which are formed successively on a surface of the silicon plate 71. To utilize the back surface reflection of the back surface electrode, a material having high reflectivity, e.g., Ag or Al, is preferably employed for back surface electrode 72. N layer 73, i layer 74 and p layer 75 constitute the pin structure, which also serves as a power generating layer. The order of p, i and n is not restricted specifically. Further, these thin films may be formed of amorphous films, microcrystal films, or microcrystal films mixed with amorphous components. For anti-reflective film 76, a conductive film is advantageously used, although it is not limited thereto. As such, the substrate (base) is formed of inexpensive raw materials with an inexpensive process, and accordingly, a less expensive thin-film solar cell can be provided.

Silicon plate 71 of the present invention has grain boundary lines formed linearly, which may be selectively etched to form concaves. The concaves thus regularly arranged serve as originating points of growth of the thin-film layer upon formation of a thin-film solar cell by plasma CVD. It thus can be said that the silicon plate has a structure very suitable for use as the substrate of the thin-film solar cell.

The present invention provides a producing method of the silicon plate characterized in that the silicon plate is formed by solidifying molten silicon on a base substrate at a temperature lower than the silicon melting temperature. The silicon plate of the present invention can be produced in the following manner.

The silicon plate of the present invention can be formed by growing silicon directly from a melt of silicon. That is, the producing method of the silicon plate according to the present invention is characterized in that molten silicon is solidified on a base substrate at a temperature lower than the silicon melting temperature to obtain the silicon plate. According to the producing method of the present invention, the step of slicing is unnecessary and there is no slice loss. Thus, it is possible to produce an inexpensive silicon plate.

Figure 6:
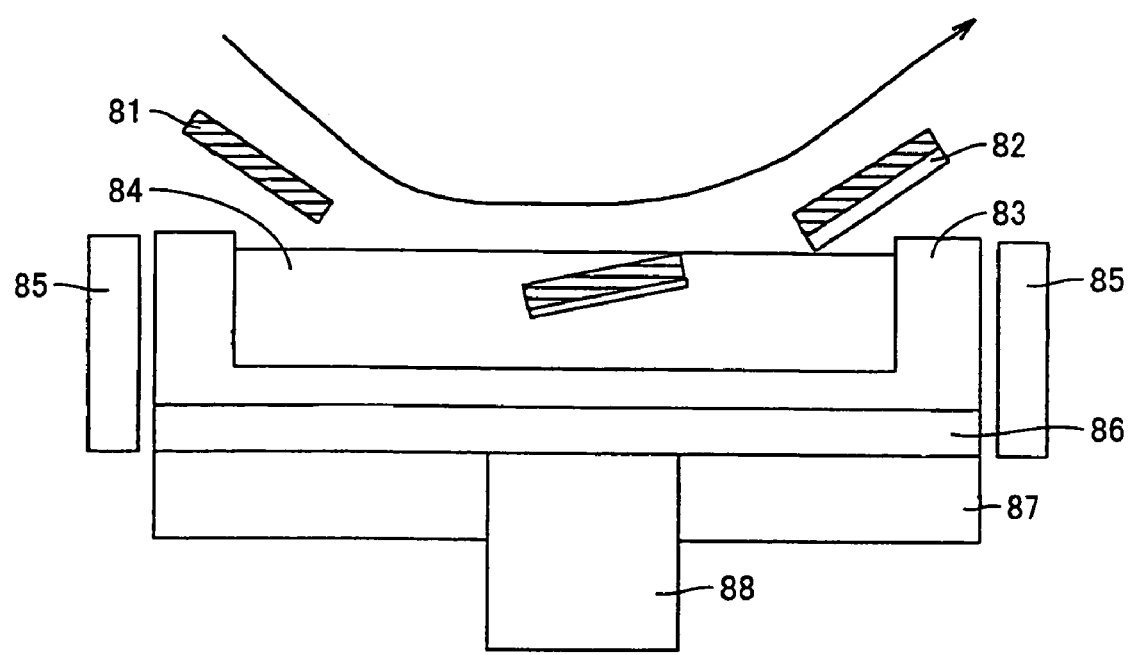
FIG. 6 schematically shows an apparatus for producing the silicon plate of the present invention.

A configuration of an apparatus for producing the silicon plate is now explained, although it is not limited thereto. As shown in FIG. 6, an apparatus for producing the silicon plate of the present invention includes a crucible 83 that is provided on a crucible elevating shaft 88 via a heat insulating material 87 and a crucible platform 86. A heater 85 is placed around crucible 83 and crucible platform 86, to maintain the silicon melt 84 within crucible 83 at a temperature of not lower than the melting point. In this apparatus, a base substrate 81 is entered in, immersed in, and removed from silicon melt 84, to form a silicon plate 82. In FIG. 6, means for moving base substrate 81, means for elevating crucible platform 86, means for controlling the heater, means for additionally introducing silicon, a chamber that can be vacuum evacuated, and other external devices of the apparatus are not shown. It however is required that base substrate 81 through crucible elevating shaft 88 are all placed within a well-sealed chamber enabling gas exchange with, e.g., inert gas after vacuum evacuation. Although it is possible to use argon, helium and others as the inert gas, argon is preferable in terms of cost. Establishment of a cyclic system can further reduce the cost. When gas containing oxygen components is used, silicon oxide will be produced and deposit on the surface of the base substrate and on the wall of the chamber. Thus, it is necessary to eliminate the oxygen components as much as possible. Further, in the gas cyclic system, it is preferable to use a filter or the like to eliminate particles of the silicon oxide.

As shown in FIG. 6, base substrate 81, at a temperature of not higher than the temperature of the silicon melt, is moved from the left in the drawing, and entered and immersed into silicon melt 84 within crucible 83. At this time, the silicon melt is held at a temperature of not lower than the melting point by heater 85. To obtain a stable silicon plate, it is necessary to design the apparatus with a configuration capable of strictly controlling the temperatures of the melt, of the atmosphere within the chamber, and of base substrate 81. With such an apparatus, it is possible to obtain the silicon plate with better reproducibility. For the growth of the silicon plate, strict temperature control of the base substrate is required. To this end, the base substrate is preferably provided with a structure permitting easy temperature control thereof.

Although the material for the base substrate is not restricted specifically, it is preferably a material excellent in heat conductivity and heat resistance, and more preferably graphite having undergone high-purity processing. For example, high-purity graphite, silicon carbide, quarts, boron nitride, alumina, zirconium oxide, aluminum nitride, and metal may be used, among which an optimal material can be selected in accordance with its object. High-purity graphite is preferable, since it is relatively inexpensive and excellent in processibility. The material of the base substrate can be selected as appropriate by taking account of various properties such as industrial inexpensiveness and qualities of the obtained silicon plate as the substrate. The combination of the base substrate with the material of the melt may also be selected as appropriate. When metal is used for the base substrate, it does not pose problems as long as it is used at a temperature of not greater than the melting point of the metal by continuously cooling the same, and as long as it does not affect the properties of the obtained sheet. Further, the surface of the base substrate may be coated with pyrolytic carbon, silicon carbide, boron nitride, or diamond-like carbon.

The base substrate of copper is used advantageously to facilitate the temperature control. Roughly two kinds of means are conceivable for cooling the base substrate, direct cooling means and indirect cooling means. With the direct cooling means, a gas is directly blown on the base substrate for cooling. With the indirect cooling means, the base substrate is cooled indirectly with a gas or a liquid. Although the coolant gas is not restricted specifically, nitrogen, argon, helium or any other inert gas is preferably used for the purpose of preventing oxidization of the silicon plate. In particular, helium or a mixed gas of helium and nitrogen is preferable from the standpoint of cooling capability, although nitrogen is more preferable when taking account of cost. The coolant gas may be used cyclically using a heat exchanger or the like, to further reduce the cost. As a result, it is possible to provide an inexpensive silicon plate.

Preferably, the base substrate is further provided with a heating mechanism. That is, it is preferable to provide not only the cooling mechanism but also the heating mechanism for controlling the temperature of the base substrate. When the base substrate is entered into the silicon melt, a silicon plate is grown on the surface of the substrate. Thereafter, the base substrate is removed from the melt. The base substrate receives heat from the silicon melt, so that the temperature of the substrate tends to increase. When the base substrate is to be immersed again into the silicon melt at the same temperature, the cooling mechanism as described above is necessary to lower the temperature of the base substrate. Whether with direct cooling or with indirect cooling, it is difficult to control the cooling rate or the substrate temperature at all times, so that the heating mechanism is required. More specifically, the base substrate once removed from the melt is cooled with the cooling mechanism, and then the heating mechanism is used to control the temperature of the base substrate until it is immersed into the silicon melt next time. The heating mechanism may be either a high-frequency induction heating type or a resistive heating type, as long as it does not affect the heater for maintaining the silicon in the molten state. As such, by combining the cooling and heating mechanisms, it is possible to considerably increase the stability of the silicon plate. The temperature of the melt is preferably not lower than the melting point. This can be controlled using a thermo couple or a radiation thermometer. When the temperature of the melt is set close to the melting point, the surface of the molten silicon may be solidified when the base substrate comes into contact with the melt. For the purpose of strictly controlling the temperature of the melt, it is directive to immerse the thermo couple in the melt, although it is not so preferable since impurity may be mixed into the melt from a protective tube of the thermo couple or the like. Thus, it is preferable to indirectly control the temperature by inserting the thermo couple into the crucible, for example.

Crucible 83 filled with silicon melt 84 is placed on heat insulating material 87, to keep the silicon melt at a constant temperature and to minimize extraction of the heat from the bottom of the crucible. Crucible platform 86 is placed on heat insulating material 87. Crucible platform 86 is connected to crucible elevating shaft 88 provided with an elevating mechanism, since it is preferable that base substrate 81 is immersed in silicon melt 84 constantly at the same depth for growth of the silicon plate thereon. Although a way of keeping the liquid level of the silicon melt, i.e., a way of adding silicon to compensate for the silicon taken away as the silicon plate, is not restricted specifically, polycrystalline silicon (mass) may be molten and introduced, a silicon melt may be added sequentially, or silicon powder may be introduced sequentially. In any case, it is preferable to add silicon while keeping the surface of the melt as level as possible. If the surface of the melt is disturbed or agitated, the waveform occurring at that time would be reflected onto the surface of the obtained silicon plate facing the melt, thereby impairing homogeneity of the obtained sheet.

A producing method of the silicon plate having the quasi-linear grain boundary lines of the present invention employing the producing apparatus of the silicon plate shown in FIG. 6 is now described.

Firstly, a crucible 83 made of high-purity graphite is filled up with high-purity silicon mass (purity: 99.9999%) having the concentration of boron adjusted such that the obtained silicon plate will have a specific resistance of 2 $\Omega \cdot cm$. The crucible is placed in the apparatus as shown in FIG. 6. Next, the chamber is vacuum evacuated, and the pressure inside the chamber is reduced to a prescribed pressure. Thereafter, Ar gas is introduced into the chamber. The Ar gas is continuously flown in from the upper portion of the chamber constantly at a rate of 10 L/min, while keeping the pressure at 800 hPa, so that a clean surface of silicon melt is obtained.

Next, a heater 85 for melting silicon is set to 1500° C., and the silicon mass within crucible 83 is completely molten. As the silicon raw material melts, the level of the liquid silicon lowers. Thus, silicon powder is additionally introduced to keep the liquid level of silicon melt 84 at a depth of not greater than 1 cm from the upper surface of crucible 83. The temperature of the heater for melting silicon is not raised to 1500° C. at one time. Rather, the temperature is increased at a rate of 10-50° C./min until it reaches about 1300° C., and it is then raised to a prescribed temperature. If the temperature is rapidly raised, thermal stress will be imposed locally on corners of the crucible, for example, thereby breaking the crucible.

Thereafter, the temperature of the silicon melt is set to 1410° C. and held for 30 minutes, to stabilize the temperature of the melt. Crucible elevating shaft 88 is then used to move crucible 83 to a prescribed position. The temperature of the silicon melt at this time is preferably not lower than 1400° C. and not higher than 1500° C. With the silicon melting point of about 1410° C., if the temperature of the silicon melt is set lower than 1400° C., the surface of the liquid silicon will gradually be solidified from the wall side of the crucible. If it is set higher than 1500° C., the growth rate of the silicon plate will be slow, leading to poor productivity.

For the growth of the silicon plate, the base substrate as shown in FIGS. 8-11 is moved from the left to the right in FIG. 6, during which a surface of the base substrate provided with protrusions and concaves, i.e., the upper surface (the irregular surface of the base substrate) in FIGS. 8-11, comes into contact with the silicon melt. The silicon plate is formed on the irregular surface in contact with the silicon melt. At this time, it is possible to obtain the silicon plate having the quasi-linear grain boundary lines effectively, since the protrusions are arranged linearly. In particular, the surface temperature of the base substrate at the time of entering into the silicon melt is preferably not lower than 300° C. and not higher than 1100° C. If the temperature of the base substrate is lower than 300° C., stable control becomes difficult. That is, in the chamber, the base substrate before being immersed into the silicon melt receives radiant heat from the silicon melt, so that it is difficult to keep it constantly at 300° C., leading to variation in quality of the obtained silicon plate. If the temperature of the base substrate is higher than 1100° C., the growth rate of the silicon plate is undesirably slow, leading to poor productivity.

For adjusting the temperature of the base substrate, it is preferable that both the cooling and heating mechanisms are provided. Provision of these mechanisms not only improves the productivity, but also improves the yield of the products and stabilizes their quality.

The silicon plate obtained by the above-described producing method using the producing apparatus as shown in FIG. 6 has the quasi-linear grain boundary lines.

With the producing apparatus having the configuration as shown in FIG. 6, the silicon plate having the quasi-linear grain boundary lines is obtained on the underside with respect to the protrusions of the base substrate. The present invention, however, is not limited thereto.

Figure 7:
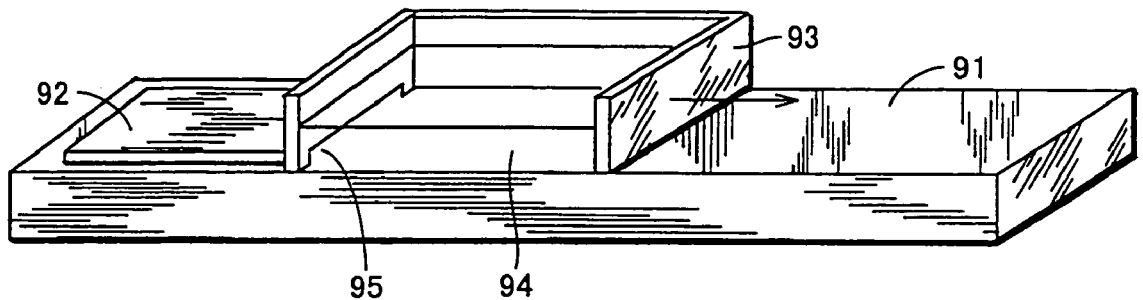
FIG. 7 schematically shows another apparatus for producing the silicon plate of the present invention.

The case where the silicon plate having the quasi-linear grain boundary lines is obtained on the upper side with respect to the protrusions of the base substrate is now described in conjunction with another apparatus for producing the silicon plate shown in FIG. 7. In this apparatus, a crucible 93 having an opening 95 at its bottom portion is placed on a base substrate 91. As crucible 93 having an opening is moved on base substrate 91, a silicon melt 94 is continuously supplied from opening 95 onto base substrate 91, so that a silicon plate 92 is produced. Means for moving crucible 93 having an opening is not shown in FIG. 7. Crystals grow on base substrate 91 to form the silicon plate. At this time, if base substrate 91 has an irregular surface as shown in FIGS. 8-11 on the side where the silicon plate grows, the silicon plate having the quasi-linear grain boundary lines can be obtained.

With this apparatus, it is necessary to heat and melt the silicon raw material in another crucible (not shown) and introduce the silicon melt into crucible 93 having an opening. Silicon plate 92 having the quasi-linear grain boundary lines can be obtained with good reproducibility when crucible 93 having an opening is rapidly moved in a direction shown in an arrow in the drawing at the same time as the silicon melt is introduced.

In this producing apparatus, the temperature control of the base substrate is easier than in the producing apparatus shown in FIG. 6. In the producing apparatus of FIG. 6, as described above, the temperature control was not easy due to a large effect of the radiant heat from the silicon melt. By comparison, in the present apparatus, base substrate 91 can simply be cooled to control it to a desired temperature. However, since base substrate 91 needs to be moved at the same time as introduction of the silicon melt, it becomes a batch type producing apparatus inferior in productivity.

To control the thickness of the obtained silicon plate having the quasi-linear grain boundary lines, the moving speed of the crucible, the temperature of the base substrate, the temperature of the silicon melt to be introduced, and clearance of the opening of the crucible may be controlled. Although the present apparatus has been illustrated to move the crucible 93 having an opening, base substrate 91 may be moved instead.

Using the above-described producing apparatuses, the silicon plate having the quasi-linear grain boundary lines of the present invention can readily be produced.

The producing method of the silicon plate according to the present invention is characterized in that a base substrate has at least protrusions on its surface coming into contact with silicon in the molten state, and the protrusions are arranged linearly.

As described above, the silicon plate of the present invention can be produced by growing silicon directly from a melt of silicon. The molten silicon is preferably solidified on a base substrate at a temperature of not higher than the silicon melting temperature, and the base substrate has a surface of an irregular structure with the protrusions arranged linearly. The step (or the difference in height) between the protrusion and the concave is preferably not smaller than 0.05 mm. The irregular structure of the surface of the base substrate may be as shown, e.g., in FIGS. 8 and 9. That is, the irregular structure is provided intentionally on the surface of the base substrate. The surface having the irregular structure comes into contact with the silicon melt. Using the base substrate having such a structure in the producing method shown in FIG. 6 or 7 facilitates control of the grain boundary lines. Dotted protrusions are provided in FIG. 8, and linear protrusions are provided in FIG. 9, although the irregular structure is not limited thereto. The dotted or linear protrusions refer to the protrusions on the surface of the base substrate that can readily be obtained by forming grooves on a flat surface of the base substrate. The tip of the protrusion may have a curvature. In particular, when inexpensive graphite is employed, for example, it is difficult to make a sharp tip of the protrusion, since the molded body of graphite in itself is an aggregate of the graphite powder.

Figure 8:
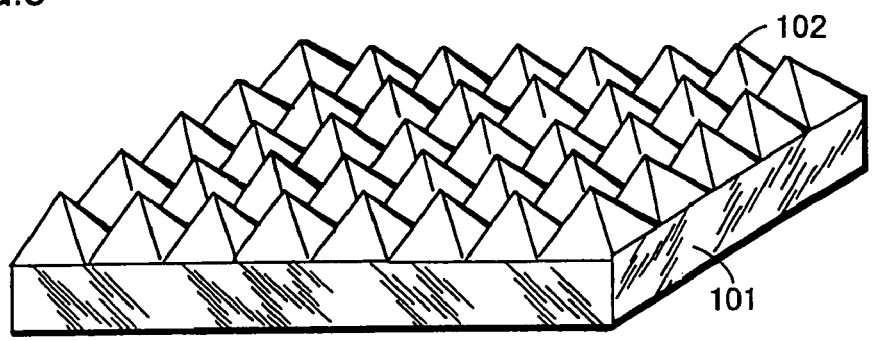
FIG. 8 is a perspective view showing a base substrate for use in producing the silicon plate having the quasi-linear grain boundary lines according to the present invention.
Figure 9:
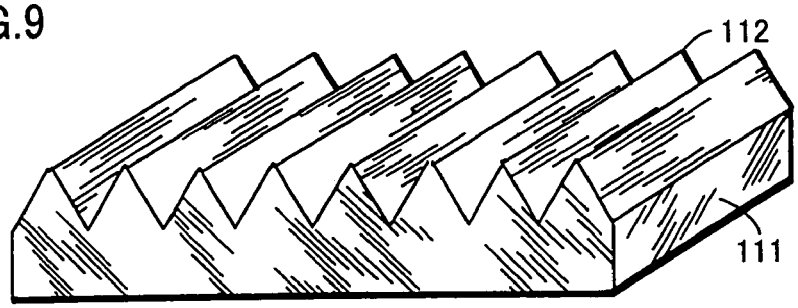
FIG. 9 is a perspective view showing another base substrate for use in producing the silicon plate having the quasi-linear grain boundary lines of the present invention.

The characteristics of the structure of the base substrate are now explained with reference to FIGS. 8 and 9. The base substrate shown in FIG. 8 is an irregular-surfaced substrate 101 having dotted protrusions 102. The base substrate shown in FIG. 9 is an irregular-surfaced substrate 111 having linear protrusions 112. Provision of either dotted protrusions 102 or linear protrusions 112 makes the obtained silicon plate having the quasi-linear grain boundary lines readily separable from the base substrate, since it is possible to restrict and control the starting points of crystal growth (or the originating points of crystal nuclei). Further, as the dotted or linear protrusions are provided, the protrusions first come into contact with the melt, so that nucleation tends to occur in the vicinity of the protrusions, also accelerating the crystal growth. As such, provision of the protrusions on the surface of the base substrate can improve separability between the base substrate and the obtained silicon plate, and also facilitate control of homogeneity and periodicity of the obtained silicon plate.

Although the concaves on the substrate surface shown in FIGS. 8 and 9 each have a V-shaped cross section, it may have a U-shaped or trapezoid-shaped cross section. Although the grooves formed have the same depth all over the base substrate, it is not limited thereto. Further, although the angles of the tips of the protrusions are shown with the same angle in the drawing, they are not limited thereto. However, the angle of the tip of the protrusion is preferably not smaller than 30°. If the angle is smaller than 30°, while nucleation occurs easily, the crystal growth rate is slow, leading to degradation of productivity. The depths of the grooves may be changed as appropriate particularly in accordance with the material used for the base substrate. However, if the depth is not greater than 0.05 mm, adhesion between the base substrate and the obtained silicon plate will be so strong that separation of the silicon plate from the base substrate becomes difficult or homogeneous growth cannot be expected. As will be described later, the quasi-linear grain boundary lines are formed corresponding to the positions of the concaves of the irregular structure of the base substrate, since the crystals start growing from the protrusions on the substrate surface and they are finally coupled at the portions corresponding to the concaves, where the quasi-linear grain boundary lines are formed.

Figure 10:
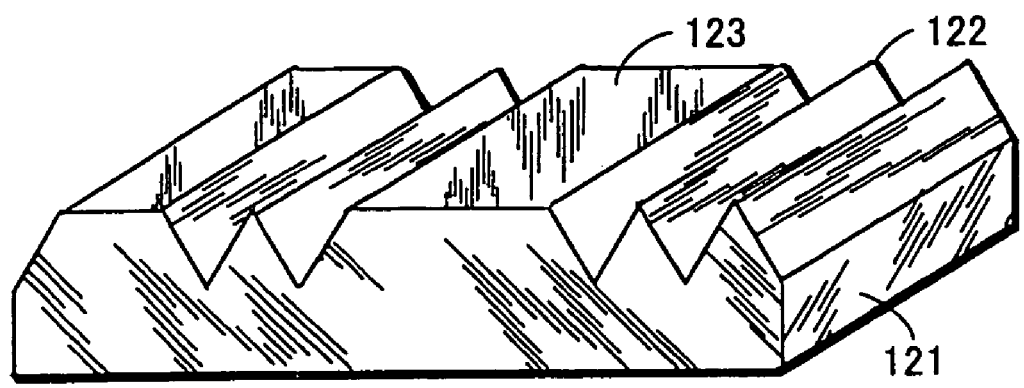
FIG. 10 is a perspective view showing a further base substrate for use in producing the silicon plate having the quasi-linear grain boundary lines of the present invention.
Figure 11:
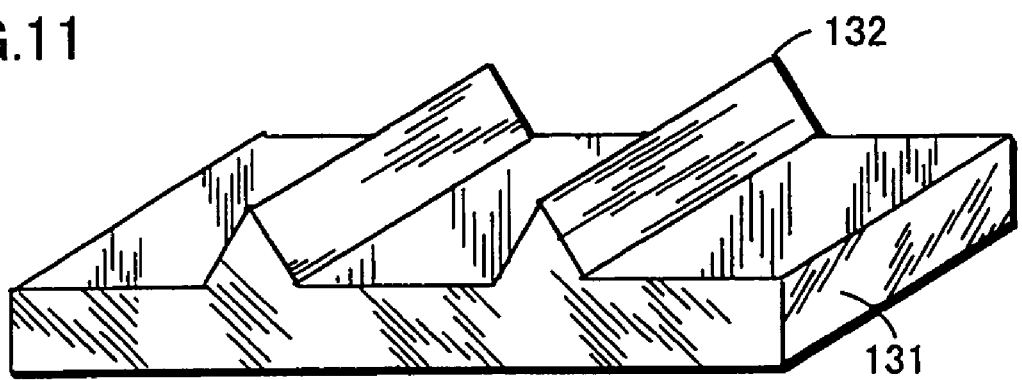
FIG. 11 is a perspective view showing yet another base substrate for use in producing the silicon plate having the quasi-linear grain boundary lines of the present invention.

Further, for forming the silicon plate having the quasi-linear grain boundary lines, an irregular-surfaced base substrate 121 having both linear protrusions 122 and planar protrusions 123 as shown in FIG. 10 may be employed. Here, the planar protrusion 123 refers to a flat surface existing on the surface of the base substrate. Even with such a base substrate having the flat surface portion, the quasi-linear grain boundary lines of the present invention can be obtained. That is, all that is needed for forming the quasi-linear grain boundary line is to form a protrusion on a surface of the base substrate on which the silicon plate is to be grown. Growth of a silicon plate on a surface of the base substrate occurs as follows.

The surface of the base substrate coming into contact with the melt is provided with protrusions. Thus, nucleation occurs dominantly in the vicinity of the protrusions that first come into contact with the melt. Crystal growth then begins from each crystal nucleus generated, since the base substrate is controlled at a temperature of not greater than the silicon melting point. As the crystal growth proceeds, the crystals grown from the adjacent protrusions are coupled to each other, so that the silicon plate having the quasi-linear grain boundary lines is formed. A base substrate 131 shown in FIG. 11 has only protrusions 132 formed thereon, with concaves having flat structures. In other words, provision of protrusions 132 enables control of the quasi-linear grain boundary lines.

The present invention provides the silicon plate characterized in that the quasi-linear grain boundary lines are located on concaves of the irregular-surfaced base substrate. That is, since silicon starts growing from the vicinity of the protrusions, the silicon crystals are coupled at portions corresponding to the concaves. The portions corresponding to the concaves of the base substrate represent the places where the quasi-linear grain boundary lines of the present invention are present. The growths from the vicinity of the protrusions advance almost simultaneously, so that the quasi-linear grain boundary lines are formed at the portions corresponding to the concaves of the base substrate. As such, the quasi-linear grain boundary lines are controlled in advance, and shaped into the form advantageous for use of the silicon plate as a solar cell.

Figure 14:
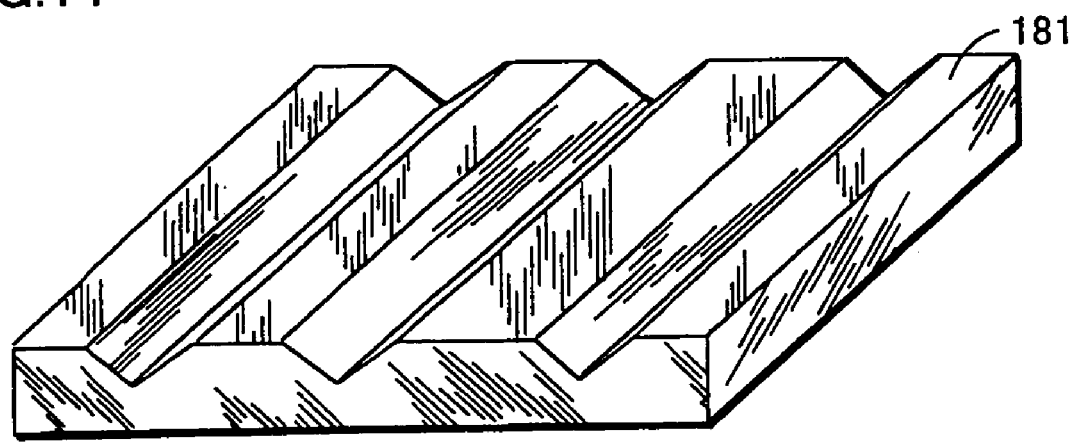
FIG. 14 is a perspective view showing another base substrate for use in producing the silicon plate having the quasi-linear grain boundary lines of the present invention.

A base substrate as shown in FIG. 14 can exhibit the similar effects on formation of the quasi-linear grain boundary lines. The base substrate 181 has V-shaped grooves formed on its upper surface. The edges between the upper surface of the base substrate and the respective grooves serve as protrusions of the base substrate. That is, when the base substrate having this shape is immersed in the silicon melt, a great number of crystal nuclei are generated at random on the flat surface portion of the base substrate. By comparison, at the edge portions of the base substrate, crystal nuclei are generated linearly, so that the obtained silicon plate has the quasi-linear grain boundary lines.

The silicon plate according to the present invention is characterized in that not more than 50 quasi-linear grain boundary lines are formed in a range of 100 $mm^2$ in the surface of the silicon plate. If more than 50 such quasi-linear grain boundary lines are formed, the grain size existing in the surface will be too small, making it difficult to improve the solar cell properties. More preferably, not more than 20 such quasi-linear grain boundary lines are formed in the range.

The silicon plate according to the present invention is characterized in that an area of the surface of the silicon plate that is surrounded by the quasi-linear grain boundary lines is not smaller than 0.25 $mm^2$. To this end, it is required that the quasi-linear grain boundary lines cross each other, as shown in FIG. 3, and that the areas are each delimited by the quasi-linear grain boundary lines. Although a square grid is illustrated in FIG. 3, it may be triangular or hexagonal. The area surrounded by the quasi-linear grain boundary lines is preferably not smaller than 0.25 $mm^2$. If the area is reduced, the grain size will become small, making it difficult to improve the solar cell properties. The area is preferably not smaller than 1 cm².

In the following examples, the producing method of the silicon plate will be explained more specifically, although the scope of the present invention is not limited thereto. The examples show formation of the silicon plate, examination of the quasi-linear grain boundary lines in the obtained silicon plate, and production of a solar cell using the obtained silicon plate.

EXAMPLES 1-3

A raw material of silicon is prepared by adjusting a concentration of boron such that a silicon plate obtained will have a specific resistance of 2 Ω·cm. A crucible made of high-purity graphite is filled with the silicon raw material, and placed in an apparatus shown in FIG. 6. Next, the chamber is vacuum evacuated, and reduced to a pressure of not greater than 10 Pa. Thereafter, Ar gas is introduced into the chamber. The Ar gas is kept flowing in from the upper portion of the chamber constantly at a rate of 10 L/min, while keeping the pressure at 800 hPa.

A heater for melting silicon is set to 1500° C. to completely melt the silicon. As the silicon raw material melts, the liquid surface lowers. Thus, an additional silicon raw material is introduced to keep the liquid surface at a prescribed level. Thereafter, the temperature of the silicon melt is set to 1410° C. and held for 30 minutes for stabilization of the temperature of the melt.

Next, a base substrate, having its temperature controlled by employing both the cooling and heating mechanisms, is immersed into the silicon melt. At this time, the base substrates of Examples 1, 2 and 3 are controlled to 300° C., 600° C. and 900° C., respectively.

The base substrate employed at this time was a base substrate 101 having an irregular surface with dotted protrusions 102 as shown in FIG. 8, with the dotted protrusions having a pitch of 0.5 mm, the grooves having a depth of 0.25 mm, and the base substrate having a size of 60 mm×60 mm.

Thereafter, the crucible is raised gradually. When it reaches a position ensuring that the irregular surface structure of the base substrate can be immersed completely, the substrate is immersed into the silicon melt. The base substrate is moved at a rate of 200 cm/min. A silicon plate obtained at this time was easily separated from the base substrate, and had a size of 60 mm×60 mm. The obtained silicon plate was analyzed using an optical microscope, and was confirmed that it had quasi-linear grain boundary lines crossing each other, which were formed corresponding to the concaves of the base substrate.

Figure 13:
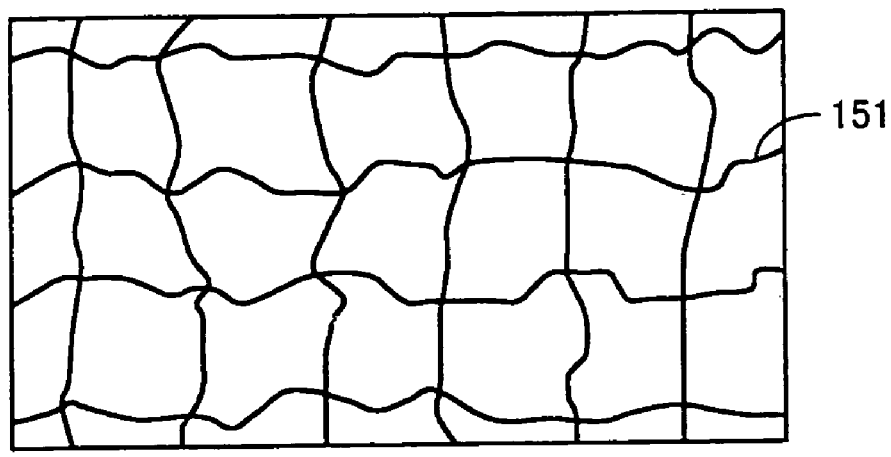
FIG. 13 shows quasi-linear grain boundary lines extracted from an optical microphotograph of a surface of the silicon plate having the quasi-linear grain boundary lines according to the present invention.

FIG. 13 shows the quasi-linear grain boundary lines extracted from an optical microphotograph of the surface of the silicon plate produced with the substrate temperature of 300° C. (Example 1). It is seen from this photograph that there are six quasi-linear grain boundary lines 151 in a vertical direction and four such lines in a horizontal direction.

A hundred such silicon plates having the quasi-linear grain boundary lines are prepared and their thicknesses are calculated from their weights.

Next, the obtained silicon plate is employed to produce a solar cell. The obtained silicon plate is subjected to etching with a mixed solution of nitric acid and hydrofluoric acid, and cleaned. Thereafter, it is subjected to alkali etching with sodium hydroxide. An n layer is formed on a p type substrate by POCl₃ diffusion. The PSG film formed on the surface of the silicon plate is removed by hydrofluoric acid, and a silicon nitride film is formed by plasma CVD on the n layer that is to be a photo accepting surface side of the solar cell. At this time, plasma CVD is conducted such that the electrodes are aligned with the quasi-linear grain boundary lines. More specifically, gas nozzles are provided at a pitch of 0.5 mm. Next, the n layer that is formed on the side to be a back surface side of the solar cell is etched away using a mixed solution of nitric acid and hydrofluoric acid, to expose the p substrate, and a back surface electrode and a p⁺ layer are formed thereon simultaneously. Next, an electrode on the photo accepting surface side is formed by screen printing. Thereafter, solder coating is effected to complete the solar cell.

Cell properties of the obtained solar cells were measured under the irradiation conditions of AM 1.5 and 100 mW/cm². The cell properties were evaluated in accordance with the "measuring method of output power for crystalline solar cells, JIS C8913 (1998)". The obtained results are shown in Table 1.

Comparative Examples 1-2

Silicon plates of Comparative Examples 1 and 2 are formed in the same manner as those of Examples 1 and 2, except that base substrates having surfaces unprovided with irregular structures are employed. The obtained results are shown in Table 1.

The quasi-linear grain boundary lines were not seen in the obtained silicon plates.

TABLE 1

| | Substrate Temperature (° C.) | Average plate thickness obtained from weights (μm) | Average of cell properties (%) |
|---|---|---|---|
| Example 1 | 300 | 512 | 13.1 |
| Example 2 | 600 | 454 | 12.9 |
| Example 3 | 900 | 389 | 13.0 |
| Comparative Example 1 | 300 | 465 | 12.1 |
| Comparative Example 2 | 600 | 359 | 11.5 |

EXAMPLES 4-9

Solar cells are produced using silicon plates. The silicon plates are formed in the same manner as in Example 1, except that the pitches of the protrusions in the irregular structures on the surfaces of the base substrates are set to 0.1 mm, 1.0 mm, 1.5 mm, 2.0 mm, 3.0 mm and 4.0 mm, that the base substrates are set to 1000° C., and that they are moved at a rate of 100 cm/min. At this time, a base substrate 111 having an irregular surface with linear protrusions 112 as shown in FIG. 9 was employed. The silicon plates obtained from the base substrates with the protrusion pitches of 0.1 mm, 1.0 mm, 1.5 mm, 2.0 mm, 3.0 mm and 4.0 mm correspond to Examples 4, 5, 6, 7, 8 and 9, respectively.

The obtained silicon plates were analyzed with an optical microscope, and it was confirmed that they had quasi-linear grain boundary lines formed corresponding to the concaves in the base substrates.

The obtained results are shown in Table 2.

TABLE 2

| | Pitch of grooves (mm) | Average plate thickness obtained from weights (μm) | Average of cell properties (%) |
|---|---|---|---|
| Example 4 | 0.1 | 451 | 10.1 |
| Example 5 | 1.0 | 434 | 12.1 |
| Example 6 | 1.5 | 425 | 12.8 |
| Example 7 | 2.0 | 470 | 12.9 |
| Example 8 | 3.0 | 550 | 13.3 |
| Example 9 | 4.0 | 612 | 13.2 |

EXAMPLES 10-13

A silicon raw material is prepared by adjusting the concentration of boron such that a silicon plate obtained will have a specific resistance of 1 Ω·cm, and silicon is completely molten in a crucible made of high-purity carbon. Next, as shown in FIG. 7, a rectangular crucible 93 having an opening at the bottom portion is placed on a base substrate 91 having an irregular-surfaced structure. At this time, as the base substrate 91, a substrate 181 having an irregular surface with linear concaves as shown in FIG. 14 was employed. The linear concaves had a pitch of 3 mm, and the depths of the grooves were set to 0.05 mm, 0.5 mm, 1.0 mm and 3.0 mm for Examples 10, 11, 12 and 13, respectively.

The base substrate having the irregular-surfaced structure is controlled to 900° C. Thereafter, molten silicon is introduced into the rectangular crucible, and at the same time, the crucible is moved at a rate of 400 cm/min to form a silicon plate having quasi-linear grain boundary lines. The obtained silicon plate had a size of 80 mm×80 mm, approximately the same as the size of the base substrate. The obtained silicon plate was analyzed and it was confirmed that it had the quasi-linear grain boundary lines formed on the concaves of the irregular surface of the base substrate.

Ten such silicon plates are prepared and the thicknesses are calculated from their weights.

Next, the obtained silicon sheet is employed to produce a solar cell. The obtained silicon sheet is subjected to alkali etching with sodium hydroxide. Thereafter, an n layer is formed on a p type substrate by POCl$_3$ diffusion. The PSG film formed on the sheet surface is removed with hydrofluoric acid, and hydrogen annealing is conducted on the n layer that is to be a photo accepting surface side of the solar cell, followed by formation of a composite film of SiO$_2$ and TiO$_2$. Next, the n layer formed on the surface that is to be a back surface side of the solar cell is etched away using a mixed solution of nitric acid and hydrofluoric acid to expose the p substrate, and a back surface electrode and a p$^+$ layer are formed thereon simultaneously. Next, an electrode on the photo accepting surface side is formed by screen printing such that the electrode is formed at a flat portion of the silicon sheet. Thereafter, solder dipping is effected to complete the solar cell. Cell properties of the produced solar cells were analyzed under the irradiation conditions of AM 1.5 and 100 mW/cm$^2$.

The cell properties were measured based on the above-described measuring method of output power for crystalline solar cells (JIS C 8913 (1998)).

The obtained results are shown in Table 3.

TABLE 3

| | Pitch of grooves (mm) | Average plate thickness obtained from weights (μm) | Average of cell properties (%) |
|---|---|---|---|
| Example 10 | 0.05 | 389 | 10.0 |
| Example 11 | 0.5 | 420 | 11.1 |
| Example 12 | 1.0 | 467 | 11.5 |
| Example 13 | 3.0 | 514 | 11.6 |

INDUSTRIAL APPLICABILITY

As described above, according to the present invention, it is possible to provide a polycrystalline silicon plate having at least one quasi-linear grain boundary line among a plurality of grain boundary lines. With the producing method of the silicon plate according to the present invention, the wafer manufacturing cost can be reduced considerably compared to the conventional case, and utilization efficiency of silicon can also be increased remarkably. As a result, it is possible to provide a less expensive solar cell.

The invention claimed is:

1. A polycrystalline silicon plate formed by solidifying molten silicon on a base substrate at a temperature of not higher than a silicon melting point, the base substrate having a surface provided with protrusions and concaves, wherein a quasi-linear grain boundary line in a surface of the silicon plate is located corresponding to one of the concaves on the surface of the base substrate.

* * * * *